(12) United States Patent
Nichols et al.

(10) Patent No.: US 9,099,826 B2
(45) Date of Patent: Aug. 4, 2015

(54) ELECTRICAL BRIDGE

(71) Applicant: Tyco Electronics Corporation, Berwyn, PA (US)

(72) Inventors: Robert Paul Nichols, Vacaville, CA (US); Brian Patrick Costello, Scotts Valley, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 176 days.

(21) Appl. No.: 13/888,977

(22) Filed: May 7, 2013

(65) Prior Publication Data

US 2014/0334110 A1   Nov. 13, 2014

(51) Int. Cl.
*H01R 13/648*   (2006.01)
*H01R 31/08*   (2006.01)
*H05K 7/14*   (2006.01)
*H05K 9/00*   (2006.01)
*H01R 13/6581*   (2011.01)

(52) U.S. Cl.
CPC .............. *H01R 31/08* (2013.01); *H05K 7/1492* (2013.01); *H05K 9/0062* (2013.01); *H05K 9/0098* (2013.01); *H01R 13/6581* (2013.01)

(58) Field of Classification Search
CPC ............................ H01R 31/08; H01R 13/6581
USPC .......................... 361/733; 174/359; 439/496
See application file for complete search history.

(56) References Cited

U.S. PATENT DOCUMENTS

| | | | | |
|---|---|---|---|---|
| 3,331,991 A | * | 7/1967 | Carlisle et al. | 361/805 |
| 7,782,632 B2 | * | 8/2010 | Della Fiora et al. | 361/826 |
| 2006/0082979 A1 | * | 4/2006 | Brandl et al. | 361/729 |
| 2008/0062655 A1 | * | 3/2008 | Laursen et al. | 361/733 |
| 2010/0182754 A1 | * | 7/2010 | Curnalia et al. | 361/733 |

\* cited by examiner

*Primary Examiner* — Hung V Ngo

(57) ABSTRACT

An electrical bridge is provided for electrically connecting first and second electronic modules that include first and second external chassis, respectively. The electrical bridge includes a rigid housing extending along a fixed path from a first end to a second end, and first and second electrical contacts held by the housing. The first and second electrical contacts are positioned at the first and second ends, respectively, of the housing. An electrical pathway is defined within the housing from the first electrical contact to the second electrical contact such that the first and second electrical contacts are electrically connected. The first and second ends of the housing are configured to be mounted to the first and second external chassis, respectively, such that the first and second electrical contacts are configured to mate with, and thereby electrically connect to, the first and second electronic modules, respectively.

16 Claims, 6 Drawing Sheets

ELECTRICAL BRIDGE

BACKGROUND OF THE INVENTION

The subject matter described herein relates generally to electrical bridges for electrically interconnecting two electronic modules in the same or different racks.

Electronics racks are standardized enclosures that are used to hold a plurality of electronic modules, for example, servers, routers, processors, computers, databases, electrical power supplies, telecommunication equipment, control and/or automation equipment, audio and/or video equipment, and/or the like. Examples of standardized electronics racks include 19-inch racks (e.g., to accommodate electronic modules having front panels that are approximately 19 inches (482.6 mm) wide), 23-inch racks, 24-inch racks, and Open racks. An electronics rack includes a frame that is divided into a plurality of regions, which are typically arranged in a vertical column. The electronic modules are held by the frame within the regions. Each region has a standardized height of approximately 1.75 inches (44.5 mm) and is commonly referred to as a unit (U) or rack unit (RU) of the electronics rack.

The electronic modules of an electronics rack are sometimes electrically connected to another electronics module that is held within the same or a different electronics rack. For example, it may be desirable to transmit electrical signals and/or electrical power between two electronics modules of the same electronics rack or of different electronics racks. Currently, it is known to provide an electrical connection between two electronics modules of the same or different electronics racks using an electrical cable. But, electrical cables may be difficult to install between the two electronic modules, for example when there is a limited amount of space adjacent the electronics rack(s). For example, the length of the electrical cable may snag and/or wrap around nearby structures (e.g., of the electronics rack(s), of the electronic modules held by the rack(s), etc.), which may interfere with the ability of a technician to neatly and/or efficiently route the electrical cable between the electronics modules. Moreover, the electrical cable may need to be cut to the desired length, which adds one or more installation steps that the technician must complete to install the electrical cable.

Another disadvantage of using an electrical cable to provide an electrical connection between two electronics modules of the same or different electronics racks is clutter. For example, the length of an electrical cable may create clutter at a rear of the electronics rack(s) where the various ports, electrical connectors, and electrical contacts of the electronic modules are located. The clutter created by an electrical cable may interfere with a technician's ability to access the electronic modules for service, maintenance, and/or installation of other components (e.g., other electronic modules, etc.) Moreover, the electrical cable may snag on the technician and/or on equipment carried by the technician, which may damage the electrical cable, may damage one or more of the electronic modules, and/or may injure the technician. The clutter created by an electrical cable may be especially problematic when multiple electrical cables are near an electronics rack. For example, the rear of an electronics rack may become completely inaccessible when a relatively large number of electrical cables are routed therethrough.

SUMMARY OF THE INVENTION

In one embodiment, an electrical bridge is provided for electrically connecting first and second electronic modules that include first and second external chassis, respectively. The electrical bridge includes a rigid housing extending along a fixed path from a first end to a second end, and first and second electrical contacts held by the housing. The first electrical contact is positioned at the first end of the housing. The second electrical contact is positioned at the second end of the housing. An electrical pathway is defined within the housing from the first electrical contact to the second electrical contact such that the first and second electrical contacts are electrically connected together. The first and second ends of the housing are configured to be mounted to the first and second external chassis, respectively, such that the first and second electrical contacts are configured to mate with, and thereby electrically connect to, the first and second electronic modules, respectively.

In an embodiment, an electronics rack includes a frame having first and second regions, and first and second electronic modules held by the frame within the first and second regions, respectively. The first and second electronic modules have first and second external chassis, respectively. The electronics rack includes an electrical bridge that electrically interconnects the first and second electronic modules. The electrical bridge includes a rigid housing extending along a fixed path from a first end to a second end, and first and second electrical contacts held by the housing. The first electrical contact is positioned at the first end of the housing. The second electrical contact is positioned at the second end of the housing. An electrical pathway is defined within the housing from the first electrical contact to the second electrical contact such that the first and second electrical contacts are electrically connected together. The first and second ends of the housing are mounted to the first and second external chassis, respectively, such that the first and second electrical contacts are mated with, and thereby electrically connected to, the first and second electronic modules, respectively.

In an embodiment, an electrical bridge is provided for electrically connecting first and second electronic modules that include first and second external chassis, respectively. The electrical bridge includes first and second rigid housings, a first electrical contact held by the first housing and being configured to mate with the first electronic module along a mating axis, and a second electrical contact held by the second housing and being configured to mate with the first electronic module along the mating axis. The electrical bridge includes an electrical cable that extends a length from a first end to a second end. The first and second ends of the electrical cable are held by the first and second housings, respectively. The electrical cable has an electrical conductor that is electrically connected between the first and second electrical contacts such that the electrical conductor defines an electrical pathway from the first electrical contact to the second electrical contact. The electrical cable includes a flexible segment that extends between the first and second housings such that the first and second electrical contacts are configured to float relative to each other. The first and second housings are configured to be mounted to the first and second external chassis, respectively, such that the first and second electrical contacts are configured to mate with, and thereby electrically connect to, the first and second electronic modules, respectively.

DETAILED DESCRIPTION OF THE INVENTION

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
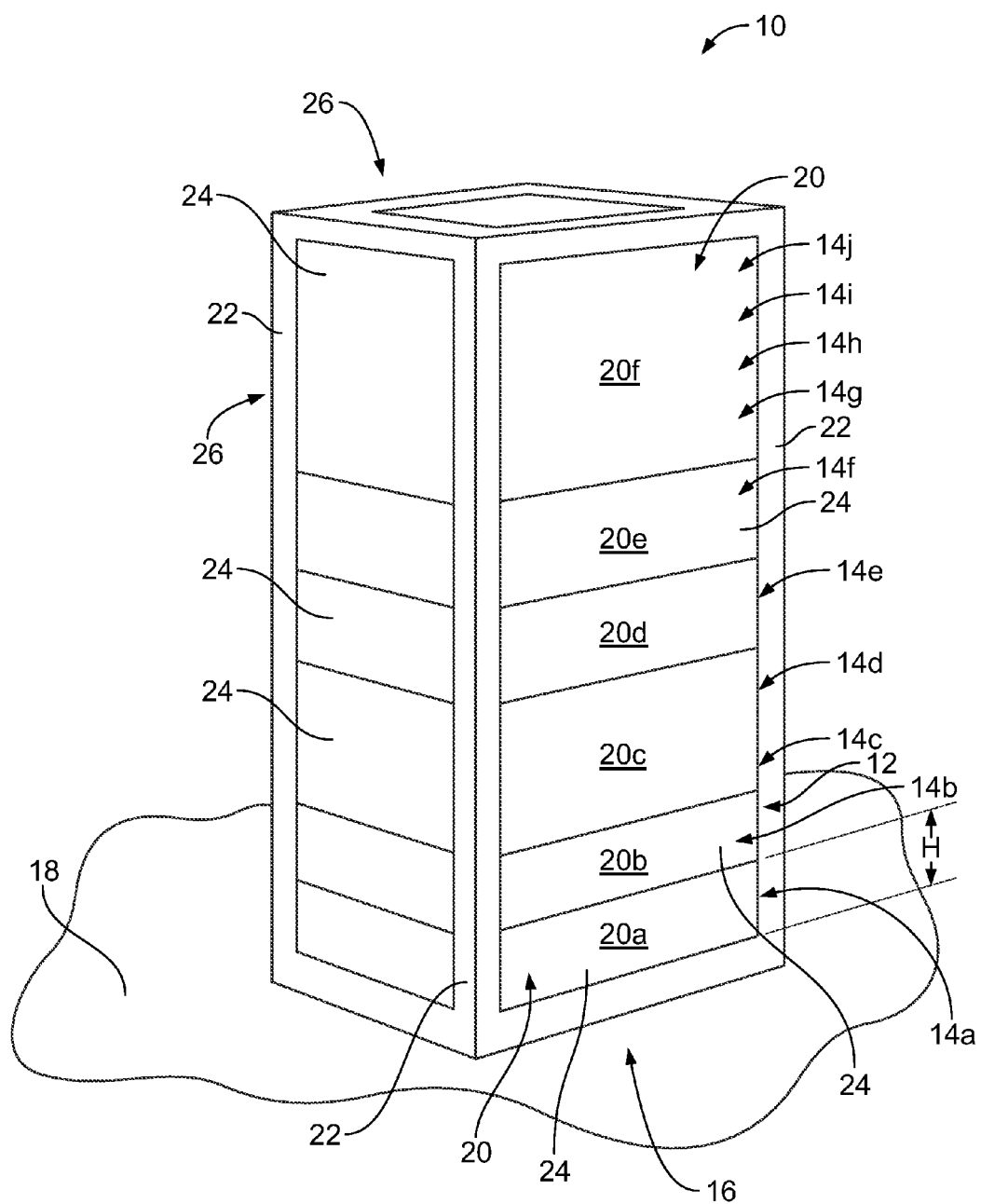
FIG. 1 is a perspective view of an exemplary embodiment of an electronics rack.

FIG. 1 is a perspective view of an exemplary embodiment of an electronics rack 10. The electronics rack 10 includes a frame 12 that is divided into a plurality of regions 14. In the illustrated embodiment, the regions 14 are arranged in a vertical column 16. Alternatively, the regions 14 are arranged in horizontal row. Moreover, in some other embodiments, the regions 14 are arranged in both rows and columns. As used herein, the terms "vertical" and "horizontal" are used to define orientation relative to a support surface 18 on which the electronics rack 10 rests and/or is mounted. In the illustrated embodiment, the support surface 18 is a floor of a building within which the electronics rack 10 is located. Other examples of the support surface 18 include, but are not limited to, ceilings, walls, and/or the like. The frame 12 of the electronics rack 10 is optionally secured (i.e., mounted) to the support surface 18 using any suitable mounting method and/or mounting hardware (not shown).

The electronics rack 10 is a standardized enclosure that is used to hold a plurality of electronic modules 20. Examples of standardized electronics racks include, but are not limited to, 19-inch racks, 23-inch racks, 24-inch racks, Open racks, and/or the like. 19-inch racks accommodate electronic modules having front panels that are up to approximately 19 inches (482.6 mm) wide, while Open racks accommodate electronic modules having front panels that are up to approximately 21.1 inches (537.0 mm) wide, for example. In some alternative embodiments, the electronics rack 10 is not a standardized electronics rack, but rather is a custom electronics rack having a custom size. Moreover, the electronics rack 10 may be another standard of electronics rack than a 19-inch rack, a 23-inch rack, or a 24-inch rack. In the illustrated embodiment, the frame 12 includes four vertical posts 22 such that the electronics rack 10 is what is commonly referred to as a "four-post" rack. But, the electronics rack 10 may include any number of vertical posts 22. For example, the electronics rack 10 may include only two vertical posts 22, which is commonly referred to as a "two-post" rack.

In the illustrated embodiment, each region 14 of the electronics rack 10 has a standardized height H of approximately 1.75 inches (44.45 mm). The regions of an electronics rack are commonly referred to as units (Us) or rack units (RUs) of the electronics rack. The regions 14 of the electronics rack 10 may have other standardized heights H, or may alternatively have custom heights H. In the illustrated embodiment, the frame 12 includes ten regions 14. But, the frame 12 may include any other number of regions 14.

The electronic modules 20 are held by the frame 12 within the regions 14. Each electronic module 20 may be held by the frame 12 such that the electronic module 20 is contained within a single region 14 or spans more than one region 14. In other words, each electronic module 20 may have any height, which may be less than, approximately equal to, or greater than the height H of the corresponding region(s) 14. For example, in the illustrated embodiment, the electronics rack 10 holds (i.e., includes) six electronic modules 20, namely the electronic modules 20a, 20b, 20c, 20d, 20e, and 20f. The electronic modules 20a and 20b are each contained within a single respective region 14a and 14b of the frame 12. The electronic module 20c is contained within (i.e., spans) two adjacent regions 14c and 14d of the frame 12, while each of the electronic modules 20d and 20e are contained within a single region 14e and 14f, respectively, of the frame 12. The electronic module 20f is contained within four adjacent regions 14g, 14h, 14i, and 14j of the frame 12. The electronic modules 20a, 20b, 20d, and 20e are each what is commonly referred to as "1U" modules, while the electronic modules 20c and 20f are commonly referred to as "2U" and "4U" modules. The electronics rack 10 may hold any number of electronic modules 20. Each of the electronics modules 20a, 20b, 20c, 20d, 20e, and 20f may be referred to herein as a "first" and/or a "second" electronic module.

Each electronic module 20 may be any type of electronic module, such as, but not limited to, a server, a router, a database, a processor, a computer, an electrical power supply, telecommunication equipment, control and/or automation equipment, audio and/or video equipment, and/or the like. Each electronic module 20 may be mounted to the frame 12 using any suitable mounting method and/or mounting hardware (not shown). Optionally, one or more of the electronics modules 20 is mounted to the frame 12 on a sliding rail (not shown). Each of the electrical modules 20 may be commonly referred to as a "rack-mount instrument", a "rack mount system", a "rack mount chassis", a "subrack", or a "shelf".

Each electronic module 20 includes an external chassis 24 that defines a housing of the electronic module 20. The external chassis 24 is electrically conductive and optionally provides electromagnetic interference (EMI) containment. Various electronic and other components of an electronic module 20 are contained within the external chassis 24. Optionally, one or more of the electronic modules 20 is a self-contained module that includes an electrical power supply housed within the external chassis 24 thereof. The electronic modules 20 may have interface components (not visible in FIG. 1) such as various ports, electrical connectors, electrical contacts, and/or the like, for example arranged along a rear 26 of the electronics rack 10. The interface components enable the electronic modules 20 to interface (e.g., communicate, receive electrical power from, supply electrical power to, and/or the like) with other electronic modules 20 in the electronics rack 10, with electronic modules located outside (e.g., remote from, near to, and/or the like) the electronics rack 10

(e.g., located within another electronics rack and/or the like), and/or with other components located outside the electronics rack 10. The external chassis 24 of each electronic module 20 may be referred to herein as a "first" and/or a "second" external chassis.

As will be described below, the electronics rack 10 includes an electrical bridge 28 (FIGS. 2-5) for electrically interconnecting two of the electronic modules 20 within the electronics rack 10 or for electrically interconnecting one of the electronic modules 20 within the electronics rack 10 with an electronic module located outside the electronics rack 10.

Figure 2:
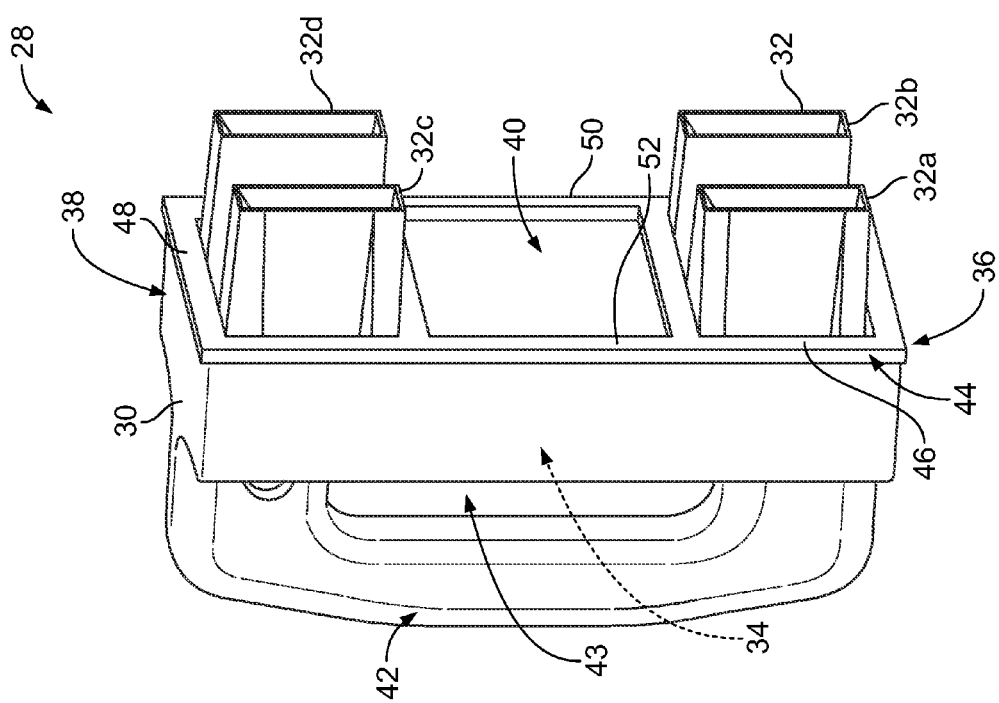
FIG. 2 is a perspective view of an exemplary embodiment of an electrical bridge for use with the electronics rack shown in FIG. 1.

FIG. 2 is a perspective view of an exemplary embodiment of the electrical bridge 28. The electrical bridge 28 includes a housing 30, two or more electrical contacts 32 held by the housing 30, and one or more internal electrical pathways 34. The housing 30 is generally rigid and extends along a fixed path from an end 36 to an opposite end 38. In some embodiments the term "rigid" is intended to mean that the housing 30 is generally not flexible such that a human being is incapable of bending the housing 30, or must exert a considerable amount of force to bend the housing 30, by more than a trivial amount. Moreover, in some embodiments, the term "fixed path" is intended to mean that the housing 30 has a sufficient rigidity that prevents a human being from changing the shape of the path of the housing 30 between the ends 36 and 38 by more than a trivial amount by bending the housing 30. In contrast, a generally flexible structure such as an electrical cable can be bent by a human being to thereby change the shape of the path of the electrical cable without exerting a considerable amount of force on the electrical cable to effect such bending. In some embodiments, the term "rigid" is intended to mean that the housing 30 has a rigidity that is greater than an electrical cable. The housing 30 may have some resilience to bending, which further distinguishes the rigidity and fixed path of the housing 30 as compared to electrical cables. Each of the ends 36 and 38 of the housing 30 may be referred to herein as a "first" end and/or a "second" end.

Figure 5:
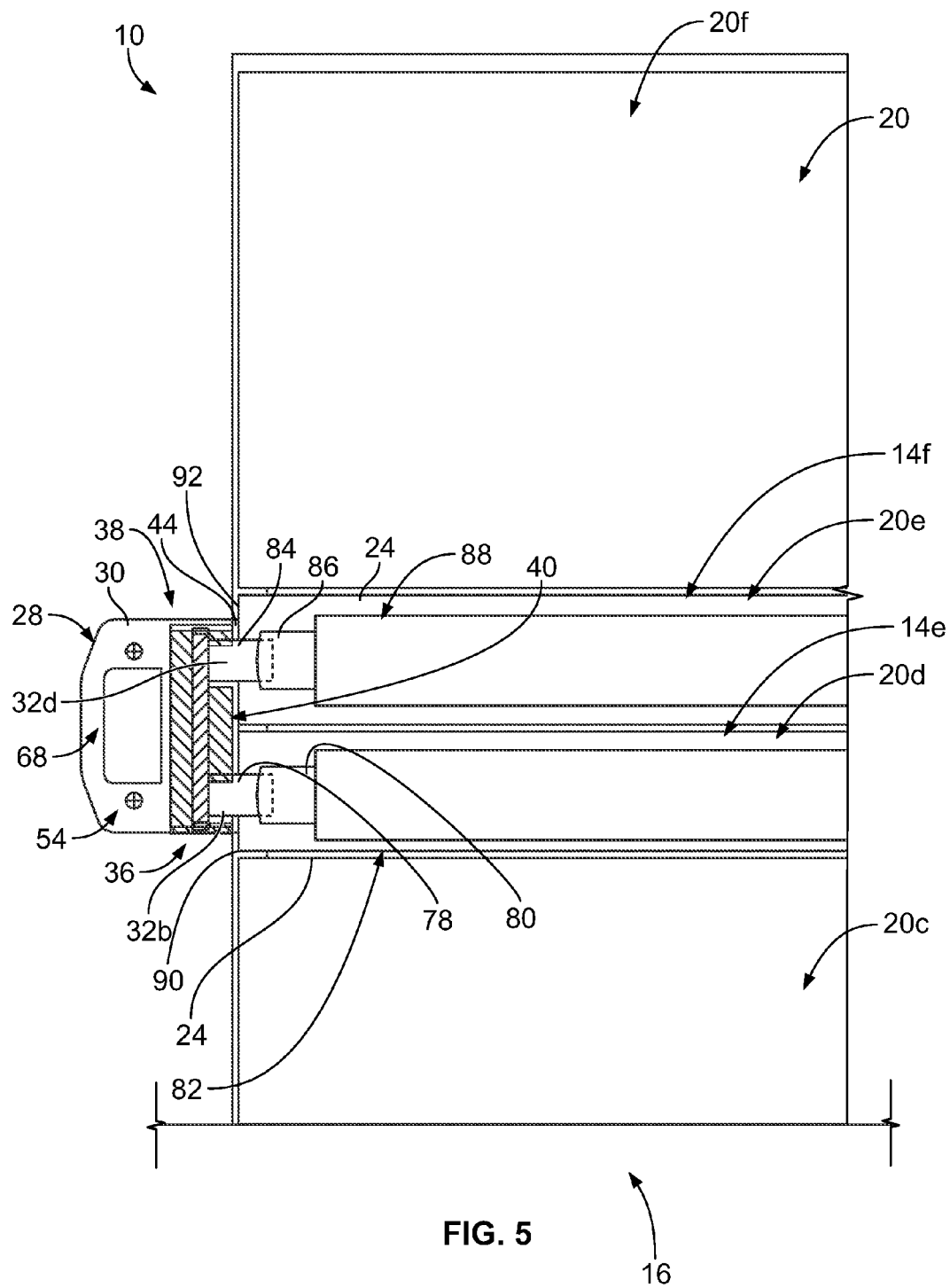
FIG. 5 is a cross-sectional view of a portion of the electronics rack shown in FIG. 1.

The housing 30 includes a mounting side 40 along which the housing 30 is configured to be mounted to two of the electronic modules 20 (FIGS. 1 and 5). Specifically, and as will be described below, the end 36 of the housing 30 is configured to be mounted to one of the electronic modules 20 and the end 38 of the housing 30 is configured to be mounted another of the electronic modules 20 to provide an electrical connection between the two electronic modules 20. In the illustrated embodiment, the electrical bridge 28 includes four electrical contacts 32, namely the electrical contacts 32a, 32b, 32c, and 32d. But, the electrical bridge 28 may include any number of the electrical contacts 32. The electrical contacts 32 extend outward along the mounting side 40 for mating with the electronic modules 20. Specifically, the pair of electrical contacts 32a and 32b are positioned at the end 36 of the housing 30, and the pair of electrical contacts 32c and 32d are positioned at the end 38 of the housing 30, as can be seen in FIG. 2. Each of the electrical contacts 32a, 32b, 32c, and 32d may be referred to herein as a "first" and/or a "second" electrical contact. The electrical contacts 32a and 32b may be referred to herein as "first" and/or "second" electrical contacts. The electrical contacts 32c and 32d may be referred to herein as "first" and/or "second" electrical contacts.

Optionally, the housing 30 includes a handle 42. The handle 42 is configured to be grasped by a user to mount the ends 36 and 38 of the housing 30 to the two electronic modules 20 and/or to dismount the ends 36 and 38 of the housing 30 from the two electronic modules 20. In the illustrated embodiment, the handle 42 extends outward on a pressing side 43 of the housing 30 that is opposite the mounting side 40. Moreover, the illustrated embodiment of the handle 42 includes a U-shape, with the ends of the U extending from the pressing side 43 of the housing 30. But, the handle 42 may have any other shape, configuration, arrangement, location, and/or the like that enables a user to grasp the handle 42 and thereby securely hold the electrical bridge 28.

The electrical bridge 28 optionally includes an EMI gasket 44 that extends on the mounting side 40 of the housing 30. The EMI gasket 44 is electrically conductive and may be at least partially resiliently compressible. The EMI gasket 44 may extend along the mounting side 40 around one or more of the electrical contacts 32. In the illustrated embodiment, the EMI gasket 44 includes a gasket segment 46 that extends along the perimeter of the mounting side 40 around the pair of electrical contacts 32a and 32b, a gasket segment 48 that extends along the perimeter of the mounting side 40 around the pair of electrical contacts 32c and 32d, and gasket segments 50 and 52 that extend along the perimeter of the mounting side 40 and interconnect the gasket segments 46 and 48. But, the EMI gasket 44 may have any other shape, configuration, arrangement, location, and/or the like that enables the EMI gasket 44 to function as described and/or illustrated herein.

As will be described below, the EMI gasket 44 is configured to be electrically connected to the external chassis 24 (FIGS. 1 and 5) of at least one electronic module 20 when the housing 30 is mounted to two of the electronic modules 20 such that the EMI gasket 44 forms a portion of an electrical circuit (e.g., an electrical ground, a shield circuit, and/or the like) that includes the EMI gasket 44 and the external chassis 24 (and optionally an EMI shield 68 (FIGS. 4 and 5) of the electrical bridge 28). The portion of the electrical circuit formed by the EMI gasket 44 is configured to at least partially suppress the escape of EMI emissions from the interface between the electrical bridge 28 and at least one of the two electronic modules 20.

Figure 3:
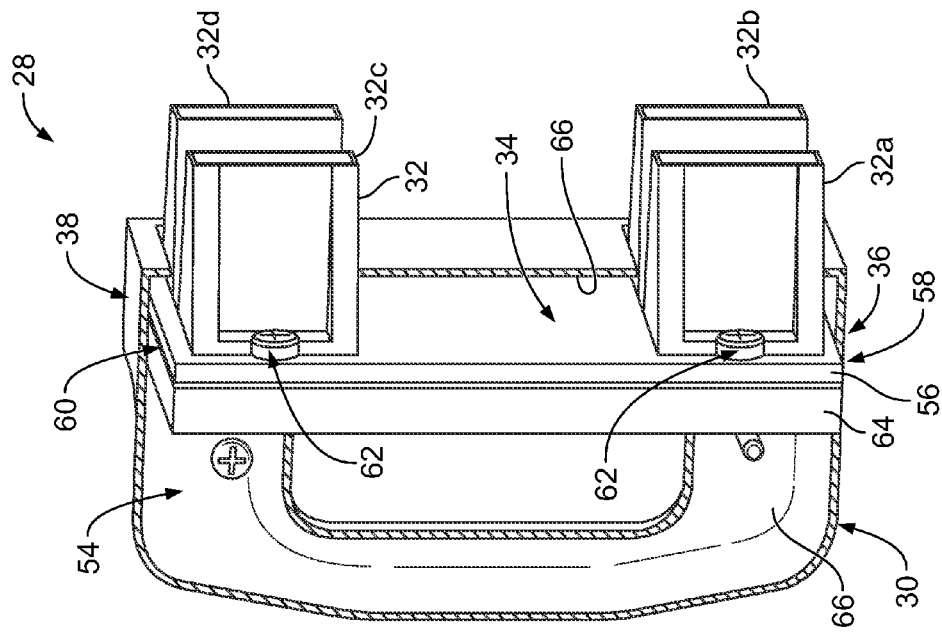
FIG. 3 is a partially broken-away perspective view of the electrical bridge shown in FIG. 2.

FIG. 3 is a partially broken-away perspective view of the electrical bridge 28 illustrating an internal cavity 54 of the housing 30. The EMI gasket 44 is not shown in FIG. 3 for clarity. As described above, the electrical bridge 28 includes one or more internal electrical pathways 34. Each electrical pathway 34 of the electrical bridge 28 is defined within the internal cavity 54 of the housing 30 from one or more electrical contacts 32 positioned at the end 36 of the housing 30 to one or more electrical contacts 32 positioned at the end 38. Each electrical pathway 34 thereby electrically connects the corresponding electrical contact(s) 32 at the end 36 of the housing 30 to the corresponding electrical contact(s) 32 at the end 38.

The electrical bridge 28 may include any number of electrical contacts 32 positioned at the end 36 of the housing 30 and any number of electrical contacts 32 positioned at the end 38 of the housing 30. In the illustrated embodiment, the electrical bridge includes two electrical contacts 32a and 32b positioned at the end 36 of the housing 30 and two electrical contacts 32c and 32d positioned at the end 38 of the housing 30, as described above. The electrical bridge 28 may include any number of electrical pathways 34 for electrically interconnecting the electrical contacts 32 at the end 36 of the housing 30 with the electrical contacts 32 at the end 38. Moreover, each electrical pathway 34 may electrically connect any number of electrical contacts 32 at the end 36 of the housing 30 with any number of electrical contacts 32 at the end 38. In the illustrated embodiment, the electrical bridge 28 includes a single electrical pathway 34 that extends from both the electrical contacts 32a and 32b at the end 36 of the housing 30 to both of the electrical contacts 32c and 32d at the end 38. In an alternative embodiment, and for example, the electrical bridge 28 may include an electrical pathway 34 that extends between and thereby electrically connects the electrical contacts 32a and 32c and another electrical pathway 34 that extends between and thereby electrically connects the electrical contacts 32b and 32d.

As will be described below, the electrical bridge 28 may be configured to transmit electrical power and/or electrical signals between the two electronic modules 20 (FIGS. 1 and 5) that are electrically connected by the electrical bridge 28. The number of electrical contacts 32 provided at the ends 36 and 38 of the housing 30, the number of electrical pathways 34 provided therebetween, and/or the like may depend on whether the electrical bridge 28 transmits electrical power and/or electrical signals, and/or may depend on the type (e.g., DC, AC, three-phase, and/or the like) of electrical power being transmitted.

In the illustrated embodiment, the electrical bridge 28 includes a bus bar 56 that defines the electrical pathway 34 from the electrical contacts 32a and 32b to the electrical contacts 32c and 32d. Specifically, the bus bar 56 extends a length from an end 58 to an opposite end 60. The end 58 of the bus bar 56 is engaged in physical contact with the electrical contacts 32a and 32b such that the bus bar 56 is electrically connected to the electrical contacts 32a and 32b at the end 58. The end 60 of the bus bar 56 is engaged in physical contact with the electrical contacts 32c and 32d such that the bus bar 56 is electrically connected to the electrical contacts 32c and 32d at the end 60. The bus bar 56 is electrically conductive such that the bus bar 56 defines the electrical pathway 34 between the electrical contacts 32a and 32b and the electrical contacts 32c and 32d. In some other embodiments, and for example, the electrical bridge 28 includes a bus bar 56 that defines an electrical path 34 between the electrical contacts 32a and 32c and another bus bar 56 that defines an electrical path 34 between the electrical contacts 32b and 32d.

Each electrical contact 32a, 32b, 32c, and 32d may be electrically and/or mechanically connected to the bus bar 56 using any suitable method and/or hardware. Alternatively, the electrical contacts 32a, 32b, 32c, and/or 32d are integrally formed with the bus bar 56 as a single unitary body. In the illustrated embodiment, the electrical contacts 32 are each held in engagement with the bus bar 56 using threaded fasteners 62 that mechanically connect the electrical contact 32 to the bus bar 56.

Figure 4:
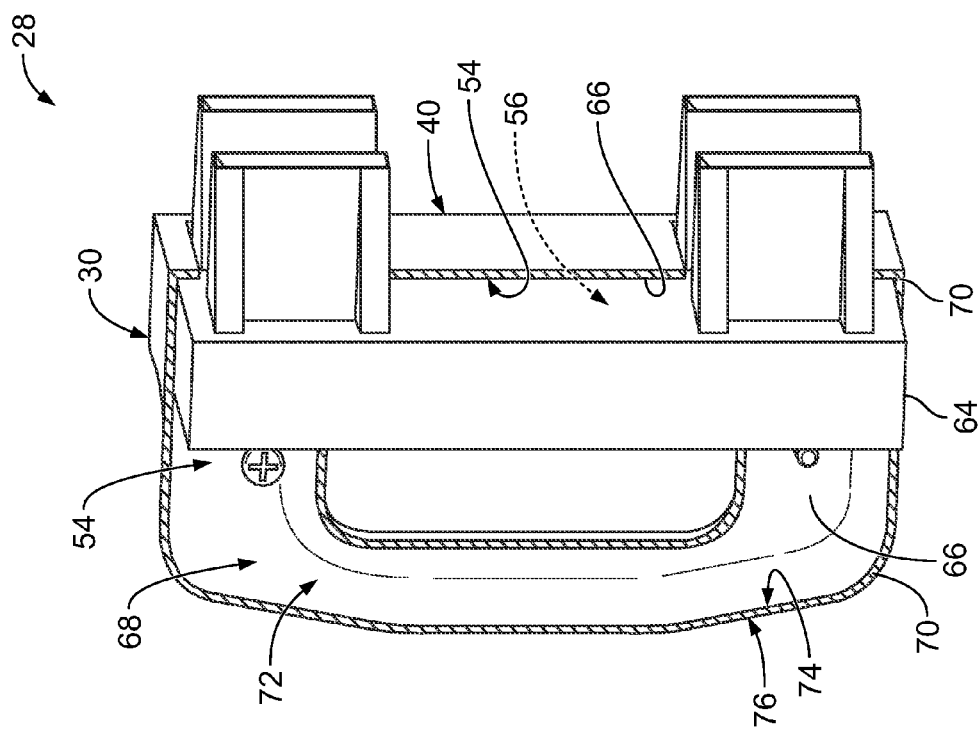
FIG. 4 is another partially broken-away perspective view of the electrical bridge shown in FIGS. 2-4 illustrating an exemplary embodiment of an insulative base of the electrical bridge.

The electrical bridge 28 includes an insulative base 64 that is received within the internal cavity 54 of the housing 30. The insulative base 64 is electrically insulative and extends within the internal cavity 54 between the bus bar 56 and an interior side 66 of the housing 30 to thereby electrically insulate the housing 30 from the bus bar 56 and the electrical contacts 32. The insulative base 64 has been partially broken away in FIG. 3 to illustrate the bus bar 56. FIG. 4 is another partially broken-away perspective view of the electrical bridge 28 illustrating the insulative base 64. As should be apparent from a comparison of FIGS. 3 and 4, the insulative base 64 envelops the bus bar 56 within the internal cavity 54 of the housing 30. The insulative base 64 thereby provides electrical insulation that extends around the bus bar 56 between the bus bar 56 and the interior side 66 of the housing 30. Optionally, the insulative base 64 provides electrical insulation that extends around an approximate entirety of the bus bar 56 between the bus bar 56 and the interior side 66 of the housing 30.

The electrical bridge 28 optionally includes an EMI shield 68 that is electrically conductive and is configured to at least partially suppress the escape of EMI emissions from the electrical bridge 28. The EMI shield 68 is configured to be electrically connected to the external chassis 24 (FIGS. 1 and 5) of at least one electronic module 20 when the housing 30 is mounted to two of the electronic modules 20 such that the EMI shield 68 forms a portion of an electrical circuit (e.g., an electrical ground, a shield circuit, and/or the like) that includes the EMI shield 68 and the external chassis 24 (and optionally the EMI gasket 44 shown in FIGS. 2 and 5). The portion of the electrical circuit formed by the EMI shield 68 is configured to at least partially suppress the escape of EMI emissions from the electrical bridge 28.

In the illustrated embodiment, the housing 30 includes a dielectric base 70 and an electrically conductive material 72 extending on the dielectric base 70. The electrically conductive material 72 defines the EMI shield 68. The dielectric base 70 includes an interior surface 74 and an opposite exterior surface 76. In the illustrated embodiment, the electrically conductive material 72 extends on the interior surface 74 of the dielectric base 70 such that the EMI shield 68 extends within the internal cavity 54 of the housing 30. The electrically conductive material 72 thus defines the interior side 66 of the housing 30 in the illustrated embodiment.

The electrically conductive material 72 may extend on any amount, any portion(s), and any location(s) of the dielectric base 70 that enables the EMI shield 68 to at least partially suppress the escape of EMI emissions from the electrical bridge 28. In addition or alternatively to extending on the interior surface 74 of the dielectric base 70, the electrically conductive material 72 may extend on the exterior surface 76 of the dielectric base 70. For example, in some alternative embodiments, the electrically conductive material 72 does not extend on the interior surface 74, but rather only extends on the exterior surface 76. In embodiments wherein the electrically conductive material 72 extends on the exterior surface 76, portions of the exterior surface 76 may be free of the electrically conductive material 72 and/or the housing 30 may include an electrically insulative material (not shown) that covers at least a portion of the electrically conductive material 72 on the exterior surface 76 to electrically insulate a user touching the handle 42 and/or another portion of the housing 30. In the illustrated embodiment, the electrically conductive material 72 extends on at least a portion of exterior surface 76 of the dielectric base 70 along the mounting side 40 of the housing 30, which enables the EMI shield 68 to electrically connect to the external chassis 24 through the EMI gasket 44 and/or by engaging in physical contact with the external chassis 24.

In some embodiments, the electrically conductive material 72 is a coating that coats the dielectric base 70. In other embodiments, the electrically conductive material 72 is a shell that is mounted to the dielectric base 70. In still other embodiments, the EMI shield 68 includes both an electrically conductive material 72 that is a coating and an electrically conductive material 72. When the electrically conductive material 72 is a coating, the coating may be applied on dielectric base 70 using any method, process, structure, means, and/or the like. Examples of suitable processes for applying the coating of the electrically conductive material 72 on the dielectric base 70 include, but are not limited to, chemical solution deposition (CSD), chemical vapor deposition (CVD), physical vapor deposition (PVD), atomic layer deposition (ALD), electrodeposition, electrocoating, electroplating, screen printing, dip coating, aerosol coating, spin coating, sputtering, and/or the like. As used herein, the electrically conductive material 72 is considered to be a coating when the electrically conductive material 72 is applied on the dielectric base 70 using a plating process.

FIG. 5 is a cross-sectional view of a portion of the electronics rack 10 illustrating the electrical bridge 28 mounted to two of the electronic modules 20. Specifically, the electrical bridge 28 is mounted to the electronic modules 20d and 20e. The end 36 of the housing 30 is mounted to the external chassis 24 of the electronic module 20d and the end 38 of the housing 30 is mounted to the external chassis 24 of the electronic module 20e. The electrical contacts 32a (FIGS. 2 and 3) and 32b at the end 36 of the housing 30 extend through one or more corresponding openings 78 of the external chassis 24 of the electronic module 20d. The electrical contacts 32a and 32b are mated with, and thereby electrically connected to, one or more corresponding electrical contacts 80 of a component 82 of the electronic module 20d. The electrical contacts 32a and 32b are thereby electrically connected to the electronic module 20d. The electrical contact 32a is not visible in FIG. 5. The electrical contacts 32c (FIGS. 2 and 3) and 32d at the end 38 of the housing 30 extend through one or more corresponding openings 84 of the external chassis 24 of the electronic module 20e. The electrical contacts 32c and 32d are mated with, and thereby electrically connected to, one or more corresponding electrical contacts 86 of a component 88 of the electronic module 20e. The electrical contacts 32c and 32d are thereby electrically connected to the electronic module 20e. The electrical contact 32c is not visible in FIG. 5. The electrical bridge 28 thereby electrically connects the electronic module 20d to the electronic module 20e.

Although not shown herein, it should be understood that the electrical contacts of the electronic modules 20 (e.g., the electrical contacts 80 and 86 of the electronic modules 20d and 20e, respectively) are optionally held by corresponding electrical connectors (not shown) of the electronic modules 20, whether or not the electrical bridge 28 includes electrical connectors (e.g., the electrical connectors 202 and 204 shown in FIG. 6) that include the electrical contacts 32.

The ends 36 and 38 of the housing 30 are optionally mechanically connected to the external chassis 24 of the electronic modules 20d and 20e, respectively. The ends 36 and 38 of the housing 30 may be mechanically connected to the external chassis 24 of the electronic modules 20d and 20e, respectively, using any suitable mounting method and/or hardware, such as, but not limited to, threaded fasteners, a clip, and/or the like. In some embodiments, the mating between the electrical contacts 32 and the electrical contacts 80 and 86 (e.g., with an interference fit and/or the like) holds the ends 36 and 38 of housing 30 to the external chassis 24 of the electronic modules 20d and 20e, respectively, whether or not the ends 36 are mechanically connected to the external chassis 24.

As can be seen in FIG. 5, the EMI gasket 44 is captured between the mounting side 40 of the housing 30 and panels 90 and 92 of the electronic modules 20d and 20e, respectively. The EMI gasket 44 is optionally compressed between the mounting side 40 of the housing 30 and the panels 90 and 92 of the electronic modules 20d and 20e, respectively. The EMI gasket 44 is engaged in physical contact with both the mounting side 40 of the housing 30 and the panels 90 and 92. The EMI gasket 44 is thereby electrically connected to the panels 90 and 92. The EMI gasket 44 is engaged in physical contact with the portions of the EMI shield 68 that extend along the mounting side 40 such that the EMI gasket 44 is electrically connected to the EMI shield 68 of the electrical bridge 28. The EMI gasket 44 and the EMI shield 68 form a portion of an electrical circuit (e.g., an electrical ground, a shield circuit, and/or the like) that includes the EMI gasket 44, the EMI shield 68, and the external chassis 24 of the electronic modules 20d and 20e. The electrical circuit formed by the EMI gasket 44 and the EMI shield 68 is configured to at least partially suppress the escape of EMI emissions from the interfaces between the electrical bridge 28 and the electronic modules 20d and 20e and from the electrical bridge 28 (e.g. from within the internal cavity 54 of the housing 30).

In the illustrated embodiment, the electronic module 20d is an electrical power supply and the electrical bridge 28 provides a jumper that supplies the electronic module 20e with electrical power from the electronic module 20d. The electrical bridge 28 may transmit any type of electrical power (e.g., DC, AC, three-phase, and/or the like) between the electronic modules 20d and 20e. In some embodiments, the electronic module 20e is a passive printed circuit board (PCB; e.g., a midplane and/or the like) and the electronic module 20d is an active electrical power supply such that the electrical bridge 28 provides an electrical link between the passive PCB and a secondary power supply. In addition or alternatively to transmitting electrical power between the electronic modules 20d and 20e, the electrical bridge 28 may be configured to transmit electrical signals between the electronic modules 20d and 20e. For example, the electrical bridge 28 may be configured to enable the electronic modules 20d and 20e to communicate with each other by transmitting data and/or other information between the electronic modules 20d and 20e. Moreover, and for example, the electrical bridge 28 may be configured to transmit a sensing signal that indicates that the electrical bridge 28 is installed to the electronic modules 20d and 20e.

In the illustrated embodiment, the electronic modules 20d and 20e are adjacent within the column 16 of the electronic modules 20. But, the electrical bridge 28 may be configured to electrically interconnect any two electronic modules 20 that are not adjacent within the column 16, such as, but not limited to, the electronic modules 20c and 20e, the electronic modules 20d and 20b (FIG. 1), 20d and 20f, 20c and 20f, and/or the like. The length of the electrical bridge 28 between the ends 36 and 38 may be selected to accommodate the distance between the two non-adjacent electronic modules 20.

The fixed path of the housing 30 between the ends 36 and 38 extends vertically (relative to the support surface 18) from the region 14e of the electronic module 20d to the region 14f of the electronic module 20e. But, in some alternative embodiments, the fixed path of the housing 30 between the ends 36 and 38 extends horizontally (relative to the support surface 18) for electrically interconnecting electronic modules 20 that are arranged in a horizontal row.

Although shown as electrically interconnecting electronic modules 20d and 20e that are held within the same electronics rack 10, the electrical bridge 28 may alternatively electrically interconnect electronic modules that are held within different electronics racks (whether the fixed path of the housing 30 extends vertically or horizontally relative to the support surface). For example, the electrical bridge 28 may be configured to electrically interconnect one of the electronic modules 20 that is held within the electronics rack 10 with another electronic module (not shown) that is held within a different electronics rack (not shown).

Figure 6:
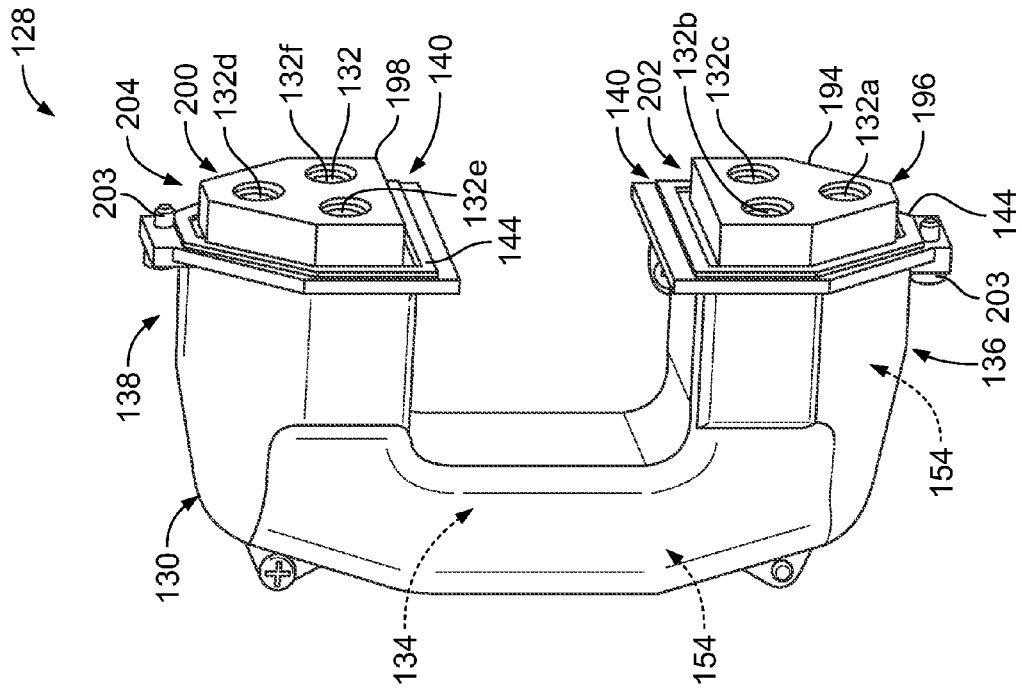
FIG. 6 is a perspective view of another exemplary embodiment of an electrical bridge.

FIG. 6 is a perspective view of another exemplary embodiment of an electrical bridge 128. The electrical bridge 128 includes a housing 130, two or more electrical contacts 132 held by the housing 130, and one or more internal electrical pathways 134. The housing 130 is generally rigid and extends along a fixed path from an end 136 to an opposite end 138. As can be seen in FIG. 6, the fixed path of the housing 130 has a U-shape such that the housing 130 is a U-shaped housing in the illustrated embodiment. Each of the ends 136 and 138 of the housing 130 may be referred to herein as a "first" end and/or a "second" end.

The housing 130 includes a mounting side 140 along which the housing 130 is configured to be mounted to two of the electronic modules 20 (FIGS. 1 and 5). Specifically, the end 136 of the housing 130 is configured to be mounted to the external chassis 24 (FIGS. 1 and 5) of one of the electronic modules 20 and the end 138 of the housing 130 is configured to be mounted to the external chassis 24 of another of the electronic modules 20 to provide an electrical connection between the two electronic modules 20. In the illustrated embodiment, the ends 136 and 138 of the housing 130 are configured to be mechanically connected to the external chassis 24 of the two electronic modules 20 using threaded fasteners 203.

In the illustrated embodiment, the electrical bridge 128 includes six electrical contacts 132, namely the electrical contacts 132a, 132b, 132c, 132d, 132e, and 132f. But, the electrical bridge 128 may include any number of the electrical contacts 132. The electrical contacts 132a, 132b, and 132c are held by a dielectric insert 194 that is held within an internal cavity 154 of the housing 130 at the end 136. Optionally, a mating end 196 of the dielectric insert 194 extends outward from the mounting side 140 of the housing 130. The electrical contacts 132d, 132e, and 132f are held by a dielectric insert 198 that is held within the internal cavity 154 of the housing 130 at the end 138. A mating end 200 of the dielectric insert 198 optionally extends outward from the mounting side 140 of the housing 130. The dielectric insert 194 and the electrical contacts 132a, 132b, and 132c define an electrical connector 202 that is held by the end 136 of the housing 130. Similarly, the dielectric insert 198 and the electrical contacts 132d, 132e, and 132f define an electrical connector 204 that is held by the end 138 of the housing 130.

Each of the electrical contacts 132a, 132b, 132c, 132d, 132e, and 132f may be referred to herein as a "first" and/or a "second" electrical contact. The electrical contacts 132a, 132b, and 132c may be referred to herein as "first" and/or "second" electrical contacts. The electrical contacts 132d, 132e, and 132f may be referred to herein as "first" and/or "second" electrical contacts. Each of the electrical connectors 202 and 204 may be referred to herein as a "first" and/or a "second" electrical connector.

The electrical bridge 128 optionally includes EMI gaskets 144 that extend on the mounting side 140 of the housing 130 at the ends 136 and 138. The EMI gaskets 144 are electrically conductive and may be at least partially resiliently compressible.

Figure 7:
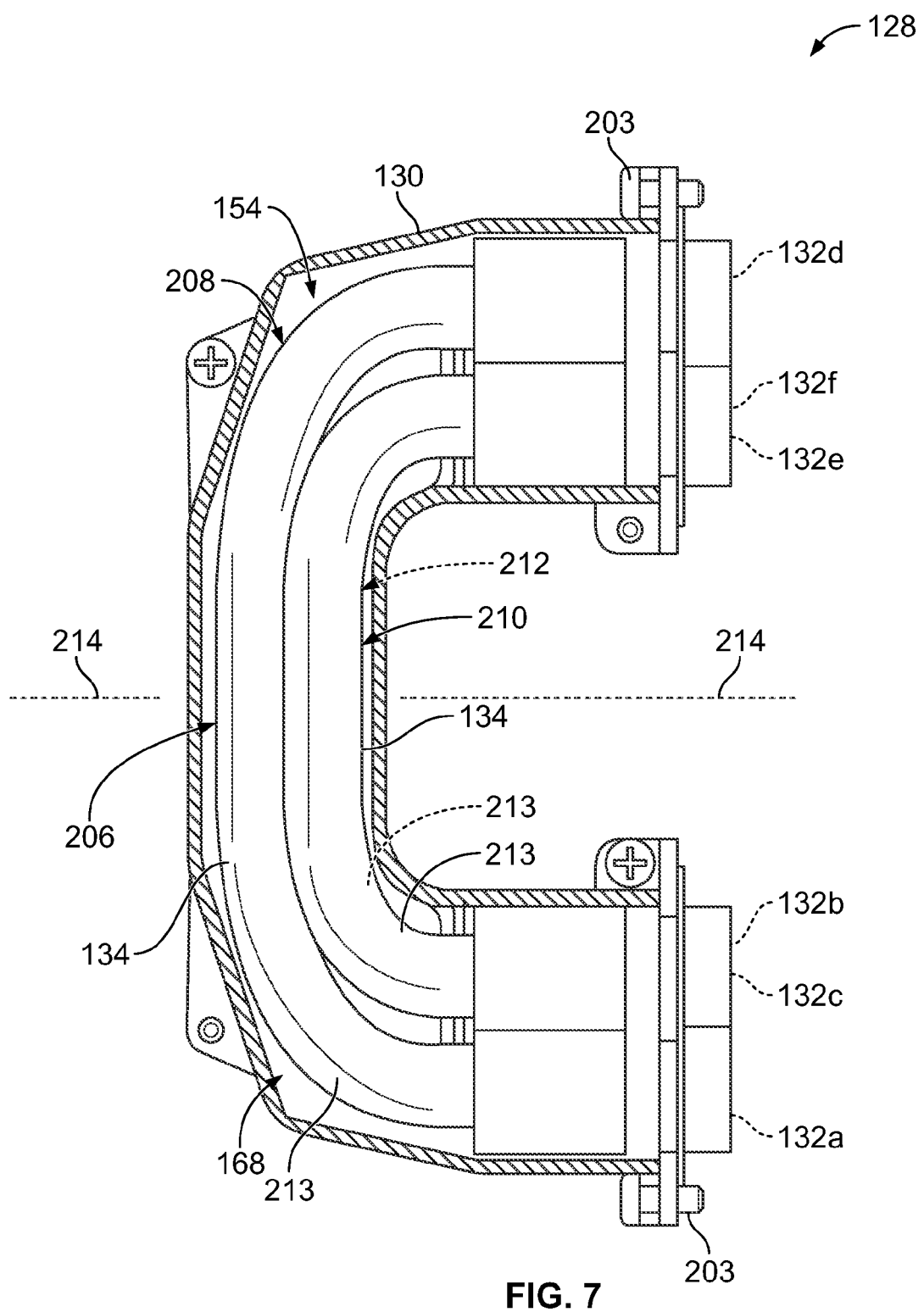
FIG. 7 is a partially broken-away elevational view of the electrical bridge shown in FIG. 6.

FIG. 7 is a partially broken-away elevational view of the electrical bridge 128 illustrating the internal cavity 154 of the housing 130. In the illustrated embodiment, the electrical bridge 128 includes an electrical cable 206 that defines three electrical pathways 134 of the electrical bridge 128. Specifically, the electrical cable 206 includes an electrical conductor 208 that extends between, and electrically interconnects, the electrical contacts 132a and 132d. The electrical conductor 208 thus defines an electrical pathway 134 between the electrical contacts 132a and 132d. The electrical cable 206 also includes an electrical conductor 210 that extends between, and electrically interconnects, the electrical contacts 132b and 132e, and the electrical cable 206 includes an electrical conductor 212 that extends between, and electrically interconnects, the electrical contacts 132c and 132f. The electrical conductors 210 and 212 thus define electrical pathways 134 between the electrical contacts 132b and 132e and between the electrical contacts 132c and 132f, respectively. The electrical conductors 208, 210, and 212 optionally include electrically insulative layers 213, as is shown in FIG. 7. The electrical cable 206 may include a shield layer (not shown) and/or an electrically insulative jacket (not shown) that surrounds the electrical conductors 208, 210, and 212.

In the illustrated embodiment, the electrical bridge 128 is configured to transmit electrical power between the two electronic modules 20 (FIGS. 1 and 5) that are electrically connected by the electrical bridge 128. But, the electrical bridge 128 may additionally or alternatively be configured to transmit electrical signals between the two electronic modules 20 that are electrically connected by the electrical bridge 128.

The housing 130 of the electrical bridge 128 optionally includes an EMI shield 168 that is electrically conductive and is configured to at least partially suppress the escape of EMI emissions from the electrical bridge 128.

The electrical bridge 128, and thus the electrical contacts 132 of the electrical bridge 128, are configured to mate with the two electronic modules 20 along a mating axis 214. Optionally, the electrical contacts 132 are held by the housing 130 such that the electrical contacts 132 are configured to float relative to the housing 130 in any direction that is approximately perpendicular to the mating axis 214. The electrical contacts 132 may be configured to float relative to the housing 130 using any suitable configuration, arrangement, structure, and/or the like. For example, each dielectric insert 194 and 198 may have a groove (not shown) that receives a flange (not shown) of the housing 130 therein, or vice versa, with a fit that enables the dielectric inserts 194 and 198 to float relative to the housing 130 in any direction that is approximately perpendicular to the mating axis 214. The floating of the dielectric inserts 194 and 198 relative to the housing 130 also floats the electrical contacts 132 relative to the housing 130. In addition or alternatively to the floating of the dielectric inserts 194 and 198, the electrical contacts 132 may be configured to float within the corresponding dielectric insert 194 and 198. The floating of the electrical contacts 132 may accommodate misalignment of the electrical contacts 132 with the corresponding electrical contacts (e.g., the electrical contacts 80 and 86 shown in FIG. 5) in one or more directions that are approximately perpendicular to the mating axis 214.

Figure 8:
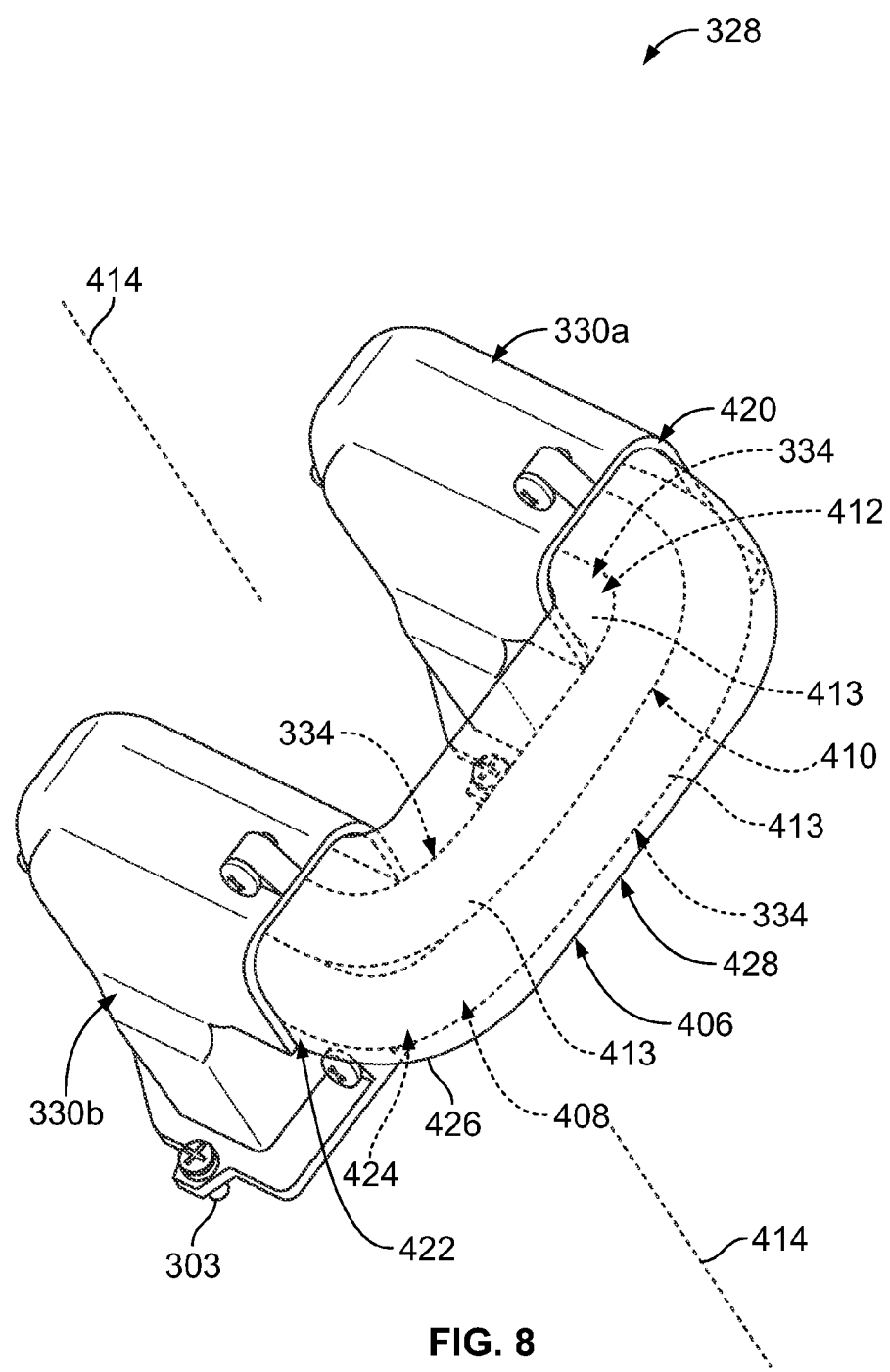
FIG. 8 is a perspective view of another exemplary embodiment of an electrical bridge.

FIG. 8 is a perspective view of another exemplary embodiment of an electrical bridge 328. The electrical bridge 328 is similar to the electrical bridge 128 (FIGS. 6 and 7) but includes two rigid housings 330a and 330b that are connected to together by an electrical cable 406. The electrical bridge 328 also includes one or more electrical contacts (not shown) held by the housing 330a and one or more electrical contacts (not shown) held by the housing 330b. The electrical cable 406 defines one or more internal electrical pathways 334 of the electrical bridge 328 that electrically interconnect the electrical contacts held by the housing 330a with the electrical contacts held by the housing 330b. The housing 330a is configured to be mounted to the external chassis 24 (FIGS. 1 and 5) of one of the electronic modules 20 (FIGS. 1 and 5) and the housing 330b is configured to be mounted to the external chassis 24 of another of the electronic modules 20 to provide an electrical connection between the two electronic modules 20. In the illustrated embodiment, the housings 330a and 330b are configured to be mechanically connected to the external chassis 24 of the two electronic modules 20 using threaded fasteners 303. Each of the housings 330a and 330b may be referred to herein as a "first" end and/or a "second" housing.

The electrical cable 406 extends a length from an end 420 to an opposite end 422. The end 420 of the electrical cable 406 is held by the housing 330a, while the end 422 is held by the housing 330b. In the illustrated embodiment, the electrical cable 406 includes three electrical conductors 408, 410, and 412 that extend between, and electrically interconnect, corresponding electrical contacts held by the housings 330a and 330b. The electrical conductors 408, 410, and 412 thus define the electrical pathways 334 that extend between corresponding electrical contacts held by the housings 330a and 330b. The electrical conductors 408, 410, and 412 optionally include electrically insulative layers 413. The electrical cable 406 includes a shield layer 424 and an electrically insulative jacket 426 that surround the electrical conductors 408, 410, and 412. The shield layer 424 and the jacket 426 are shown in phantom in FIG. 8 for clarity. Each of the ends 420 and 422 may be referred to herein as a "first" and/or a "second" end.

The housings 330a and 330b of the electrical bridge 328 optionally include EMI shields (not shown) that are electrically conductive and are configured to at least partially suppress the escape of EMI emissions from the housings 330a and 330b. The EMI shields may be configured to engage in physical contact with the shield layer 424 of the electrical cable 406 to electrically connect the EMI shields to the shield layer 424 and thereby at least partially suppress the escape of EMI emissions along the electrical bridge 328.

The housings 330a and 330b of the electrical bridge 328 are configured to mate with the two electronic modules 20 along a mating axis 414. The electrical cable 406 is flexible such that a segment 428 of the electrical cable 406 that extends between the housings 330a and 330b is flexible. The flexibility of the segment 428 enables the housings 330a and 330b to float relative to each other. The floating of the housings 330a and 330b relative to each other may accommodate misalignment of the electrical contacts (e.g., the electrical contacts 80 and 86 shown in FIG. 5) of the two electronic modules 20 with respect to each other. For example, the electrical contacts (and/or corresponding electrical connectors) of the two electronic modules may not extend within the same vertical (relative to the support surface 18 shown in FIGS. 1 and 5) plane.

Optionally, the electrical contacts of the electrical bridge 328 are held by the housings 330a and 330b such that the electrical contacts are configured to float relative to the corresponding housings 330a and 330b in any direction that is perpendicular to the mating axis 414.

The embodiments described and/or illustrated herein may provide an electrical bridge that is more easily installed between two electronics modules, for example as compared to an electrical cable. The embodiments described and/or illustrated herein may provide an electrical bridge that can be installed between two electronics modules using less steps, for example as compared to an electrical cable. The embodiments described and/or illustrated herein may provide an electrical bridge that occupies a reduced amount of space and/or creates a reduced amount of clutter near an electronics rack, for example as compared to an electrical cable. The embodiments described and/or illustrated herein may provide an electrical bridge that is less likely to damage the electronic modules and/or is less likely to injure a technician, for example as compared to an electrical cable. The embodiments described and/or illustrated herein may provide an electrical bridge that does not prevent access to an electronics rack.

The embodiments described and/or illustrated herein may provide an electrical bridge that provides an increased amount of EMI containment, for example as compared to an electrical power cable.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. An electrical bridge for electrically connecting first and second electronic modules that include first and second external chassis, respectively, the electrical bridge comprising:
   a rigid housing extending along a fixed path having a U-shape from a first end to a second end;
   first and second electrical contacts held by the housing, the first electrical contact being positioned at the first end of the housing, the second electrical contact being positioned at the second end of the housing; and
   an electrical pathway defined within the housing from the first electrical contact to the second electrical contact such that the first and second electrical contacts are electrically connected together, wherein the first and second ends of the housing are configured to be mounted to the first and second external chassis, respectively, such that the first and second electrical contacts are configured to mate with, and thereby electrically connect to, the first and second electronic modules;
   wherein the U-shape of the fixed path of the housing defines a handle that is configured to be grasped by a user to at least one of mount the first and second ends of the housing to the first and second electronic modules, respectively, or dismount the first and second ends of the housing from the first and second electronic modules, respectively.

2. The electrical bridge of claim 1, further comprising a bus bar that defines the electrical pathway from the first electrical contact to the second electrical contact.

3. The electrical bridge of claim 1, further comprising a bus bar and an electrically insulative base, the bus bar extending within an internal cavity of the housing and defining the electrical pathway from the first electrical contact to the second electrical contact, the electrically insulative base extending within the internal cavity of the housing between the bus bar and the housing to electrically insulate the housing from the bus bar and the first and second electrical contacts.

4. The electrical bridge of claim 1, further comprising an electrical cable having an electrical conductor that defines the electrical pathway from the first electrical contact to the second electrical contact.

5. The electrical bridge of claim 1, wherein the first electrical contact comprises at least two first electrical contacts positioned at the first end of the housing and the second electrical contact comprises at least two second electrical contacts positioned at the second end of the housing, the electrical pathway comprising at least two electrical pathways that each extend from a corresponding one of the first electrical contacts to a corresponding one of the second electrical contacts to electrically connect the corresponding first and second electrical contacts together.

6. The electrical bridge of claim 1, wherein the first and second electronic modules are held within the same electronics rack.

7. The electrical bridge of claim 1, wherein the first and second electrical contacts held by the housing are configured to mate with the first and second electronic modules, respectively, along a mating axis, the first and second electrical contacts being held by the housing such that the first and second electrical contacts are configured to float relative to the housing in at least one direction that is approximately perpendicular to the mating axis.

8. The electrical bridge of claim 1, wherein the housing comprises an electromagnetic interference (EMI) shield that is configured to be electrically connected to at least one of the first or second chassis such that the EMI shield is configured to at least partially suppress the escape of EMI emissions from the electrical bridge.

9. The electrical bridge of claim 1, wherein the housing comprises a dielectric base having an interior surface and an opposite exterior surface, the housing comprising an electromagnetic interference (EMI) shield that is configured to be electrically connected to at least one of the first or second chassis such that the EMI shield is configured to at least partially suppress the escape of EMI emissions from the electrical bridge, the EMI shield comprising at least one of an electrically conductive shell or an electrically conductive coating that extends on at least one of the interior surface or the exterior surface of the dielectric base.

10. The electrical bridge of claim 1, wherein the housing comprises a mounting side along which the housing is configured to be mounted to the first and second electronic modules, the housing comprising an electromagnetic interference (EMI) shield that is configured to be electrically connected to at least one of the first or second chassis such that the EMI shield is configured to at least partially suppress the escape of EMI emissions from the electrical bridge, the electrical bridge further comprising an EMI gasket that extends on the mounting side around the first and second electrical contacts, the EMI gasket being configured to be electrically connected to at least one of the first or second external chassis when the housing is mounted to the first and second electronic modules such that the EMI gasket is configured to at least partially suppress the escape of EMI emissions from an interface between the electrical bridge and at least one of the first or second electronic modules.

11. An electronics rack comprising:
a frame having first and second regions;
first and second electronic modules held by the frame within the first and second regions, respectively, the first and second electronic modules having first and second external chassis, respectively; and
an electrical bridge that electrically interconnects the first and second electronic modules, the electrical bridge comprising:
a rigid housing extending along a fixed path from a first end to a second end;
first and second electrical contacts held by the housing, the first electrical contact being positioned at the first end of the housing, the second electrical contact being positioned at the second end of the housing; and
an electrical cable having an electrical conductor that defines an electrical pathway within the housing from the first electrical contact to the second electrical contact such that the first and second electrical contacts are electrically connected together, wherein the first and second ends of the housing are mounted to the first and second external chassis, respectively, such that the first and second electrical contacts are mated with, and thereby electrically connected to, the first and second electronic modules, respectively.

12. The electronics rack of claim 11, wherein the first and second regions of the frame are arranged in a vertical column, the fixed path of the housing of the electrical bridge extending vertically from the first region to the second region.

13. The electronics rack of claim 11, wherein the housing of the electrical bridge comprises a handle that is configured to be grasped by a user to at least one of mount the first and second ends of the housing to the first and second electronic modules, respectively, or dismount the first and second ends of the housing from the first and second electronic modules, respectively.

14. An electrical bridge for electrically connecting first and second electronic modules that include first and second external chassis, respectively, the electrical bridge comprising:
first and second rigid housings;
a first electrical contact held by the first housing and being configured to mate with the first electronic module along a mating axis;
a second electrical contact held by the second housing and being configured to mate with the first electronic module along the mating axis; and
an electrical cable extending a length from a first end to a second end, the first and second ends of the electrical cable being held by the first and second housings, respectively, the electrical cable having an electrical conductor that is electrically connected between the first and second electrical contacts such that the electrical conductor defines an electrical pathway from the first electrical contact to the second electrical contact, the electrical cable comprising a flexible segment that extends between the first and second housings such that the first and second electrical contacts are configured to float relative to each other, wherein the first and second housings are configured to be mounted to the first and second external chassis, respectively, such that the first and second electrical contacts are configured to mate with, and thereby electrically connect to, the first and second electronic modules, respectively.

15. The electrical bridge of claim 14, wherein the first and second electrical contacts are held by the first and second housings, respectively, such that the first and second electrical contacts are configured to float relative to the first and second housings, respectively.

16. The electrical bridge of claim 14, further comprising first and second electrical connectors that are held by the first and second housings, respectively, the first electrical connector comprising the first electrical contact, the second electrical connector comprising the second electrical contact.

* * * * *